(12) United States Patent
Perlov et al.

(10) Patent No.: US 7,084,007 B2
(45) Date of Patent: Aug. 1, 2006

(54) FABRICATION AND ASSEMBLY STRUCTURES AND METHODS FOR MEMORY DEVICES

(75) Inventors: Craig M Perlov, Belmont, CA (US); Christopher A Schantz, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/697,457

(22) Filed: Oct. 30, 2003

(65) Prior Publication Data

US 2004/0090845 A1 May 13, 2004

(51) Int. Cl.
*H01L 21/50* (2006.01)
*H01L 21/48* (2006.01)
*H01L 21/44* (2006.01)
*H01L 21/82* (2006.01)

(52) U.S. Cl. ...................... 438/107; 438/132
(58) Field of Classification Search ................ 438/107, 438/21, 197, 132; 361/749; 257/686
See application file for complete search history.

(56) References Cited

U.S. PATENT DOCUMENTS

| | | | | |
|---|---|---|---|---|
| 4,287,525 A | * | 9/1981 | Tagawa | ...................... 347/148 |
| 4,473,892 A | * | 9/1984 | Gilligan | ........................ 365/51 |
| 4,623,986 A | | 11/1986 | Chauvel | |
| 5,008,496 A | * | 4/1991 | Schmidt et al. | ............. 174/254 |
| 5,185,689 A | | 2/1993 | Maniar | |
| 5,224,023 A | * | 6/1993 | Smith et al. | ................. 361/784 |
| 5,453,769 A | | 9/1995 | Schwarzl et al. | |
| 5,459,641 A | * | 10/1995 | Kuriyama | ................... 361/760 |
| 5,776,797 A | | 7/1998 | Nicewarner, Jr. | |
| 5,792,943 A | * | 8/1998 | Craig | ........................ 73/61.52 |
| 5,854,534 A | | 12/1998 | Beilin et al. | |
| 6,007,888 A | | 12/1999 | Kime | |
| 6,055,180 A | | 4/2000 | Gudesen et al. | |
| 6,142,611 A | * | 11/2000 | Pan | .............................. 347/63 |
| 6,683,377 B1 | * | 1/2004 | Shim et al. | .................. 257/723 |

FOREIGN PATENT DOCUMENTS

| | | | |
|---|---|---|---|
| EP | 0564295 A1 | * | 6/1993 |
| WO | WO 98/58383 | | 12/1998 |
| WO | WO 01/06563 | | 1/2001 |

* cited by examiner

*Primary Examiner*—Maria F. Guerrero

(57) ABSTRACT

The present invention provides for a common substrate with multiple sections, each constituting a separate layer of a memory device. Fold lines are arranged on the substrate to define separate sections and to provide a means for folding the sections on each other to form a multiple-layer memory device. In one application, a substrate has a fold line formed by alterations to the substrate material to form a fold line on the substrate. A first conductor section is formed with an array of parallel conductors or wires spaced across the section. A second section on the common substrate has an array of parallel conductors or wires spaced across the second section, the conductors being perpendicular to the conductors on the first section. The first and second sections are folded along the fold line over on top of each other, after a semiconductor layer has been deposited on one or both of the conductor layers, thereby forming a matrix of memory cells. The fold line is formed by removal of some of the material, such as by perforations or depressions, by deforming the material, such as by creasing, or by altering a property of the material, such as by changing the strength or flexibility of the substrate material.

The conductors or the first section may also be fabricated with narrowing cross-section areas at points where fuses are to be set to an open circuit.

12 Claims, 9 Drawing Sheets

FABRICATION AND ASSEMBLY STRUCTURES AND METHODS FOR MEMORY DEVICES

FIELD OF THE INVENTION

The present invention pertains to the field of digital memory circuits. More particularly, this invention relates to fabrication and assembly structures and methods for memory devices.

BACKGROUND OF THE INVENTION

Many consumer devices are now constructed to generate and/or utilize digital data in increasingly large quantities. Portable digital cameras for still and/or moving pictures, for example, generate large amounts of digital data representing images. Each digital image may require up to several megabytes (MB) of data storage, and such storage must be available in the camera. To provide for this type of data storage application, the storage memory should be relatively low in cost for sufficient capacities of around 100 MB to one gigabyte (GB). The storage memory should also be low in power consumption (e.g. <<one Watt) and have relatively rugged physical characteristics to cope with the portable battery powered operating environment. For archival storage, data need only be written to the memory once. Preferably the memory should have a short access time (in the order of milliseconds) and moderate transfer rate (e.g. 20 Mb/s). Preferably, also, the storage memory should be able to be packaged in an industry standard interface module, such as PCMCIA, Smart Media, SD, Memory Stick or Compact Flash card.

One form of write-once compact information storage is shown in U.S. Pat. No. 6,055,180, granted to Gudesen et al. on Apr. 25, 2000 in which matrices of individually addressable cells are provided in layers between orthogonally arranged conductors. The cells may be comprised of crosspoint diodes, OLEDs, bistable liquid crystal elements or other devices that change state with the introduction of heat and/or light.

Another application in portable devices for providing high density archival storage is described in co-pending U.S. patent application Ser. No. 09/875,356, entitled "Write-Once Memory", the disclosure of which is hereby incorporated herein by reference. The memory system disclosed therein, referred to as portable inexpensive rugged memory (PIRM), aims to provide high capacity write-once memory at low cost for archival storage. This is realized in part by avoiding silicon substrates, minimizing process complexity and lowering areal density. The memory system includes a memory module formed of a laminated stack of integrated circuit layers constructed on plastic substrates. Each layer contains cross-point diode memory array, and sensing of the data stored in the array is carried out from a separate integrated circuit remotely from the memory module.

Because PIRM memory is relatively inexpensive, users will likely acquire a large number of PIRM modules with a variety of stored content. It is important to be able to fabricate and assemble memory modules in straightforward and relatively inexpensive processes that minimize the need for precision while maximizing information storage density and simplifying addressing, reading and writing functions.

In layered memory modules, such as described above, it is essential that the layers alternately containing a memory medium and multiple orthogonal conductors be precisely fabricated and aligned so that the cross points of conductors on either side of a memory layer are correctly aligned to form precise junctions for accurate diode production. If each layer is separately fabricated, an alignment structure is needed to assure that the layers are precisely stacked. There is a need for a simpler process for fabricating and assembling such layers to enhance precision in the stacking process while providing for a simplified fabrication process.

Moreover, to reduce manufacturing costs, diode memory elements are formed on plastic webs using roll to roll manufacturing rather than on silicon wafers. In order to meet the density requirements, photolithography techniques cannot be used. Instead the conductor wires may be formed by a method such as an emboss and lift-off process, as described in the co-pending U.S. patent application entitled "Write-Once Memory" referenced above. Accordingly the top wire grid must be made separately, instead of being fabricated on top of the bottom wire grid. This requirement mandates a method of manufacture in which the top and bottom wire grids are made separately but easily assembled without complicated alignment procedures.

SUMMARY OF THE INVENTION

The present invention provides for a common substrate having multiple sections, each providing for a separate layer of a memory device. One or more fold lines are arranged on the substrate to define the boundaries of the sections and to provide a means for folding the sections on each other to form a multiple-layer memory device so that the operable part of adjacent layers are aligned to enable interaction. Semiconductor material is preferably deposited on one or both of adjacent folded layers.

In one preferred embodiment, an assembly structure for a memory device includes a substrate having at least one fold line thereon, dividing the substrate into at least two sections.

A layer of memory materials is fabricated on each of the two sections. Each layer is disposed so that the layers of memory materials on sections adjacent to each other are aligned to form at least one operable electronic device with the two sections folded on each other along the fold line.

In another preferred embodiment, a common substrate has one or more fold lines formed by alterations to the substrate material to form a multiple sections on the substrate. A first section on the common substrate has a first array of parallel conductors or wires spaced across the section. A second section on the common substrate has a second array of parallel conductors or wires, the second array of conductors being perpendicular to the first array of conductors on the first section. Semiconductor materials are deposited on one or both sections. The first and second sections are folded along the fold line over on top of each other, thereby forming a matrix of operable memory devices.

Each fold line is formed along a line segment which is parallel to the intended fold and is confined to a small region of the substrate extending in a direction perpendicular to the intended fold. The fold line is formed by removal of some of the material, such as by perforations or depressions, by physically deforming the material, such as by creasing, or by altering a property of the material, such as by changing the strength, elasticity or state of the substrate material.

In a variation of the above preferred embodiment, the conductors on the first section are fabricated with narrowing cross-section areas at points where fusable elements, such as fuses or diodes acting as fuses, are to be changed to an open circuit, i.e. "blown." The conductors in the second section may also be configured with narrowing cross-section areas where fuseable elements are to be blown, so that the combined narrowing of both conductors at the same point where they are aligned considerably lower the amount of current or voltage needed to blow selected elements. In this manner, very low currents or voltages are needed to program the memory device after it has been assembled.

In another preferred embodiment of the invention, more than one fold line is provided in a common substrate so that multiple layers are formed on a common substrate. Carefully selected fold lines enable multiple layers to be folded over each other in different configurations. The fold lines may be parallel to each other or may be angled with respect to each other in any configuration necessary to obtain a desired result.

In another preferred embodiment, the assembly structure includes a center section having a set of conductor lines on both sides of the substrate to facilitate providing multiple semiconductor devices on both sides of the center section after folding.

Other aspects and advantages of the present invention will become apparent from the following detailed description, which in conjunction with the accompanying drawings illustrates by way of example the principles of the present invention.

DETAILED DESCRIPTION OF THE PREFERRED EMBODIMENT

Write-once memory circuits, storage systems, addressing and sensing circuits and methods for producing, implementing and using such circuits and systems are disclosed herein. In the following description, for purposes of explanation, specific nomenclature and specific implementation details are set forth to provide a thorough understanding of the present invention. However, it will be apparent to one skilled in the art that these specific details are not necessarily required in order to practice the present invention.

In the following description, where "data" is referred to it will be appreciated that such "data" may be represented in various ways depending upon the context. As an example, "data" in a memory cell might be represented by a voltage level, a magnetic state, or a physical characteristic such as electrical resistance that presents a measurable effect such as voltage or current level or change to a sensing circuit, for instance. On the other hand, on a bus or during transmission such "data" might be in the form of an electrical current or voltage signal. Furthermore, herein "data" in most circumstances is primarily binary in nature which may for convenience be referred to as represented by states of "0" and "1", but it will be appreciated that the binary states in practice might be represented by relatively different voltages, currents, resistances or the like and it is generally immaterial whether a particular practical manifestation represents a "0" or a "1".

The present invention comprises structures and methods for fabricating and assembling a memory storage array. A preferred embodiment of this invention will be discussed in the context of a cross-point diode memory array of the type utilized in the memory system described in the aforementioned co-pending U.S. patent application. In order to provide a thorough understanding of the invention, the following detailed description is therefore presented in the context of such a memory system, although those skilled in the art will recognize that the invention is not limited in application to the described structure.

A Write-Once Memory System

A portable, inexpensive, rugged memory (PIRM) system that is particularly useful for data storage in applications, such as digital cameras and portable digital audio devices, is shown and described in detail in the copending U.S. patent application for "Write-Once Memory" described above. The memory system may be incorporated into an industry standard portable interface card (e.g. PCMCIA or CF) so that it can be used in existing and future products with such interfaces. The described memory module circuitry provides for write-once data storage, including data detection, write enabling and addressing functions. Interface and control circuitry is provided that comprises circuitry for control, interface, detection, error correction coding (ECC) and the like for each removable memory module when it is received in the card. The memory module is received in a socket or the like in the memory card, so that it may be removed therefrom and replaced with another memory module. When received in the memory card, the memory module is coupled to the interface and control circuit through an internal interface. In another embodiment, the module and the controllers are packaged together in a single device.

In order to increase storage capacity of the memory module for a given base area, the module is constructed from a stack of laminated layers. The layers each include addressing circuitry coupling the respective memory arrays through the memory system internal interface to the interface and control circuit. The addressing circuitry on each layer enables fewer interconnecting conductors between the layers of the memory module, which facilitates ease of fabrication and thus lowered costs.

Figure 1:
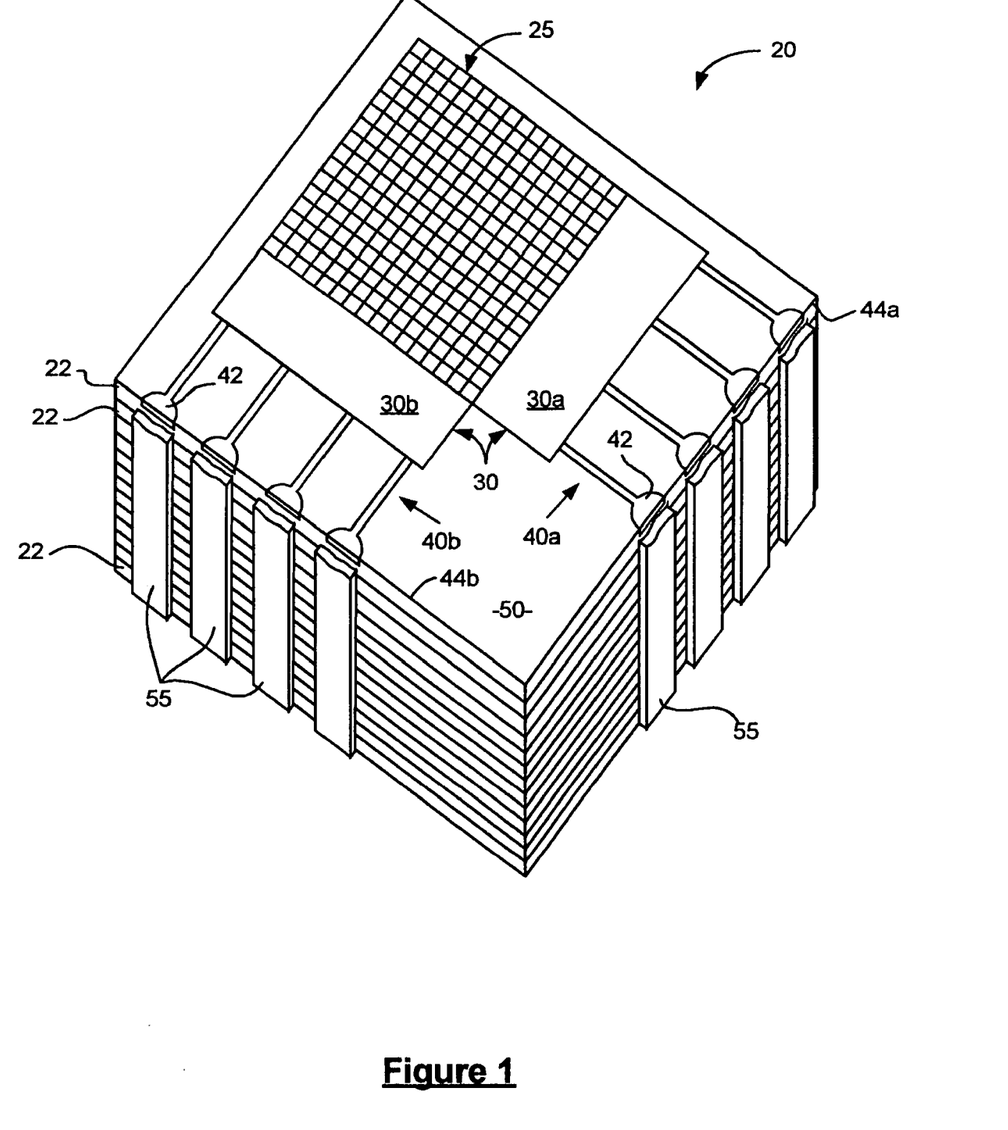
FIG. 1 is a cut-away isometric view of a write-once memory module constructed in accordance with an embodiment of the invention.

FIG. 1 is a cut-away isometric view of a memory module 20, illustrating a possible physical arrangement of circuits and layers in the memory module. Each of the layers 22 comprises a memory array 25 and addressing circuits 30 formed on a substrate 50. The memory array 25 comprises a matrix of memory elements 26 (See FIG. 2). The addressing circuits 30 comprise column and row multiplexing/demultiplexing (mux/demux) circuit portions that are positioned adjacent respective orthogonal edges of the memory array 25. Input/output (I/O) leads 40 are also formed on the substrate during the fabrication process. In the memory module 20, row I/O leads 40a extend from the row mux/demux circuit 30a to a first adjacent edge 44a of the substrate, and column I/O leads 40b extend from the column mux/demux circuit 30b to a second adjacent edge 44b of the substrate. Each of the leads 40 terminates at respective contact pads 42, portions of which are exposed at the edges 40a and 40b of the substrate 50.

A plurality of layers 22 are stacked in the same orientation and laminated together. Electrical contact is made to the exposed portions of the contact pads 42 of the stacked layers by conductive contact elements 55, which are illustrated in partial cut-away view in FIG. 1. The contact elements 55 extend along the sides of the memory module 20, transverse to the plane of the individual layers 22. Each contact element 55 as illustrated makes electrical contact to a respective contact pads of a plurality of the layers in the stack. The contact elements 55 can be used to couple the memory module 20 through the memory system internal interface (not shown).

In the preferred implementation of the memory module the substrate 50 for each of the layers 22 is formed from a polymer plastics material. The processes by which the integrated circuits (e.g. memory array and addressing circuitry) can be formed on the substrate, and the layers assembled into a memory module are described in detail in the specification of the aforementioned co-pending U.S. patent application entitled "Write-Once Memory."

Figure 2:
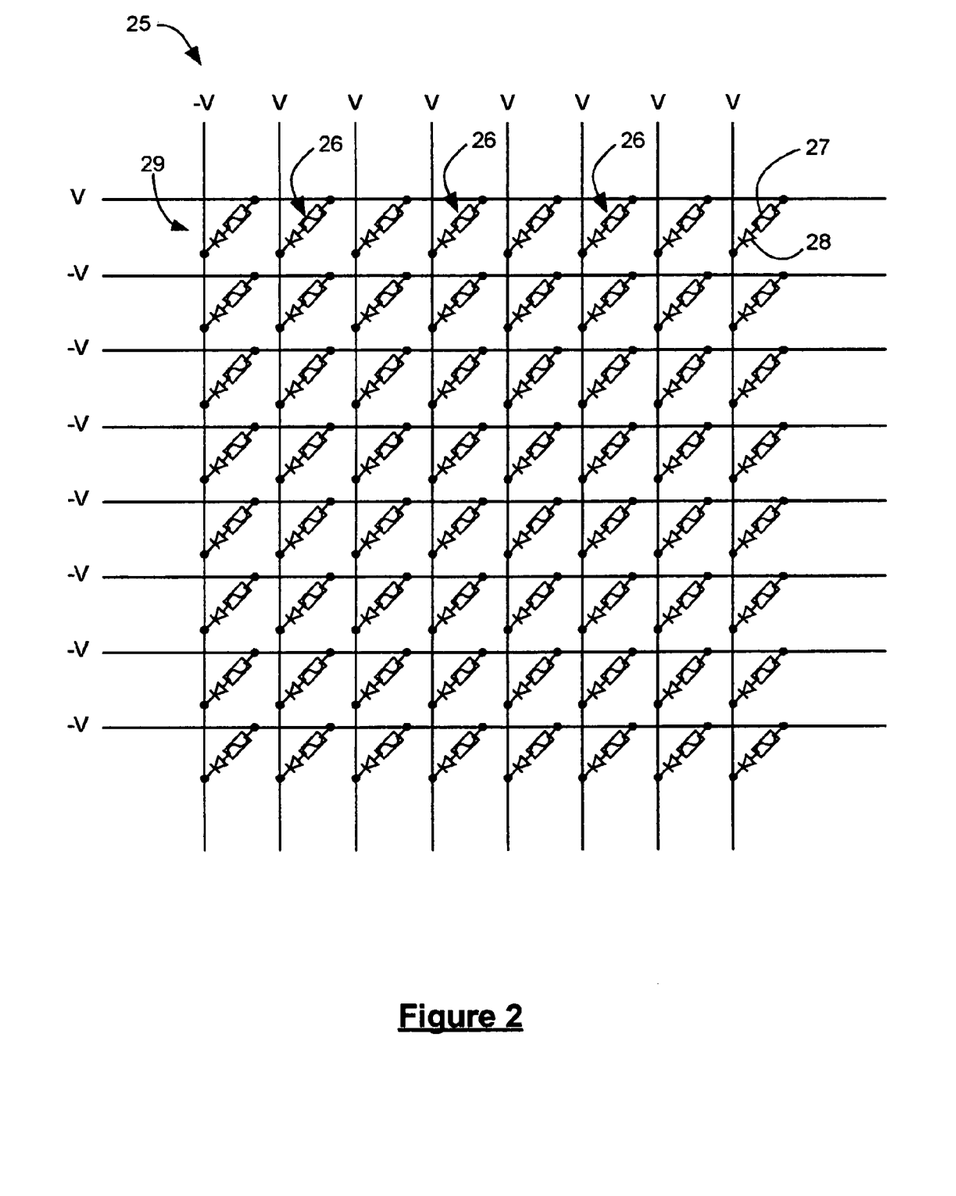
FIG. 2 shows a write-once memory array for illustration of addressing memory elements thereof.

FIG. 2 is a schematic representation of a cross-point write-once diode memory array. The figure shows an eight row by eight column array. An array 25 of memory elements 26 is formed on each of the layers 22 in the memory module 20. The memory array comprises a regular matrix of column lines and row lines with a memory element at each column/row intersection. Coupled between each of the column lines and row lines is a memory element 26. In the preferred implementation of the memory array, each memory element 26 comprises a fuse element 27 coupled in series with a diode element 28. The fuse element 27 provides the actual data storage effect of the memory element, and the diode 28 facilitates addressing of the memory element using the row and column lines for writing and reading data.

The preferred operation of the memory array 25 is as follows. At fabrication, each of the memory elements 26 has a fuse element 27 that is conductive. The conductive state of the fuse element represents one binary data state, say a data "0". In order to write data to the memory array, each memory element in which it is desired to store a data "1" is addressed using the column and row lines and the fuse element therein, or the cross-point diode acting as a fuse, is "blown", placing it in a non-conductive state. The non-conductive state of the fuse element represents the other binary data state, say a data "1". Blowing the fuse element is a one-way operation, which makes the memory a "write-once" storage, as discussed hereinabove. A data writing operation (e.g. writing a data "1" to a selected memory element) can be performed by applying a predetermined current through a selected row line to a selected column line, for example, sufficient to blow the fuse of the memory element that directly interconnects those row/column lines. Data can be read from the memory array by addressing memory elements using the column and row lines and sensing which memory elements are conductive (data "0"s) and which are non-conductive (data "1"s). In another preferred embodiment, an antifuse device may be used, in which the data state described above is reversed.

The diode element 28 in each memory element 26 of the array assists in addressing the memory elements uniquely using the column and row lines for writing and reading data. Without a diode in the row/column cross-point memory elements there are current paths through many memory elements between a given column line and row line. However, with the diode element forming a one-way conduction path through each memory element, a single column line and single row line can be used to uniquely address a single memory element. In other words, forming a circuit from one row line to one column line permits current to pass through only a single memory element. By applying a predetermined "data writing" current through that circuit, the fuse in the memory element can be blown to change a data "0" to a data "1". Also, by sensing the resistance in the circuit it is possible to determine whether the memory element fuse is blown or intact, thereby reading a data "1" or data "0".

As shown in FIG. 2, if voltages are applied to the row and column electrodes as depicted (i.e. all the column electrodes are a potential V except for one which is at −V, and all the row electrodes are at −V except for one which is at V), then only one diode will be forward biased. For the case depicted in FIG. 2 only the diode (29) in the upper left corner of the array will be forward biased. The diodes in the top row and left-most column will have no bias on them and the remaining diodes in the array will be reverse biased. This constitutes an addressing scheme for the array. If a current flows between the rows and columns with the electrodes at these potentials then the fuse of the upper left diode is intact (e.g. representing a data "0"). Conversely, if no current flows in this configuration then the corresponding diode/fuse has been blown (e.g. representing a data "1"). By modulating the amplitudes of the voltages applied to the array electrodes, more current can be made to flow through the selected diode. If this voltage causes a current that exceeds the threshold current of the fuse then the fuse can be blown, changing the state of the memory element. This constitutes a method for writing to the memory.

Figure 3:
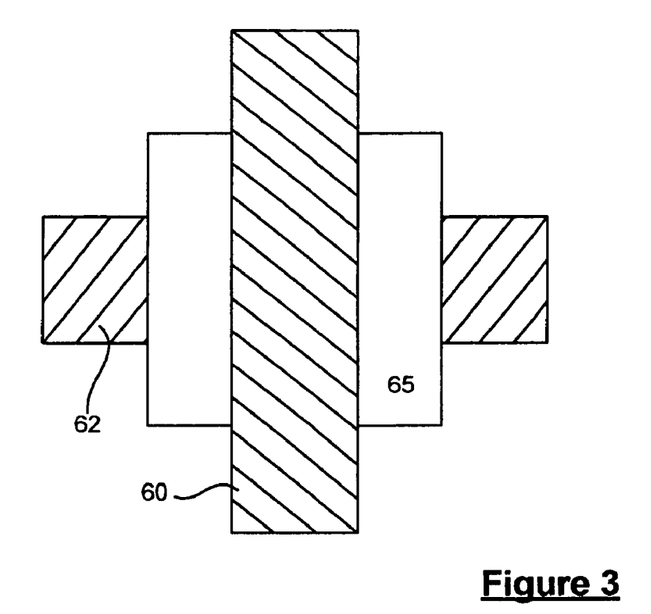
FIG. 3 is a simplified plan view of a cross-point array memory unit cell.

The memory array is sometimes herein referred to as a cross-point array memory in view of the structure thereof, and FIG. 3 provides a simplified plan view of a unit cell of the memory array of the preferred embodiment. The basic structure of the cross-point array memory comprises two layers of orthogonal sets of spaced parallel conductors arranged with a semiconductor layer therebetween. The two sets of conductors form row and column electrodes overlaid in such a manner that each of the row electrodes intersects each of the column electrodes at exactly one place. At each of these intersections a connection is made between the row electrode (62 in FIG. 3) and column electrode (60 in FIG. 3) through the semiconductor layer (65 in FIG. 3) that acts in the manner of a diode and a fuse in series. The diodes in the array are all oriented so that if a common potential is applied between all the row electrodes and all the column electrodes then all the diodes will be biased in the same direction. The fuse element may be realized as a separate element that will open circuit when a critical current is passed therethrough or it may be incorporated in the behavior of the diode.

The actual current required to blow a fuse in the memory array (or the voltage to be applied to achieve that current) should be predictable and controllable at the time of fabrication. Since it is current density through the memory elements that is the operative factor, the applied voltage/current at which an element will blow can be adjusted by varying the junction area of the element. For example, if the cross-sectional area of the intersection of the cross-point electrodes is reduced this also reduces the current/voltage required to be applied to reach the critical current density to blow the fuse. This scheme can be used in the design and fabrication of the memory circuits to ensure that control voltages can be applied to blow only the desired cross-point fuses.

Although commonly in this description the semiconductor layer (e.g. 65) is referred to in the singular, in practice a plurality of layers of different materials may be employed. The layers may include materials that are not semiconductors, such as metals and even dielectrics in various configurations. The materials and structures suitable for implementing the desired functions are described in the copending U.S. patent application entitled "Write-Once Memory," mentioned previously.

Structures and Methods For Fabrication and Assembly

Fabrication of the PIRM memory module described herein may carried out in accordance with the methods of fabrication provided in co-pending U.S. patent application Ser. No. 09/875,572, entitled "Fabrication Techniques for Addressing Cross-Point Diode Memory Arrays," the disclosure of which is hereby incorporated herein by reference.

Preferably, the substrate is initially provided in the form of a roll of plastic about three feet wide and many feet long. As the substrate is moved from the unwind roll to the wind roll, semiconductor patterns are deposited on the substrate. Preferably, the fold lines discussed above are also formed in the substrate, using one of the methods previously discussed. Thereafter, the substrate is cut into individual sections for further processing. The individual substrates are folded along the fold lines to produce multiple layers of semiconductor devices, being aligned so that corresponding elements of operable devices, such as diodes, are operational.

Figure 4:
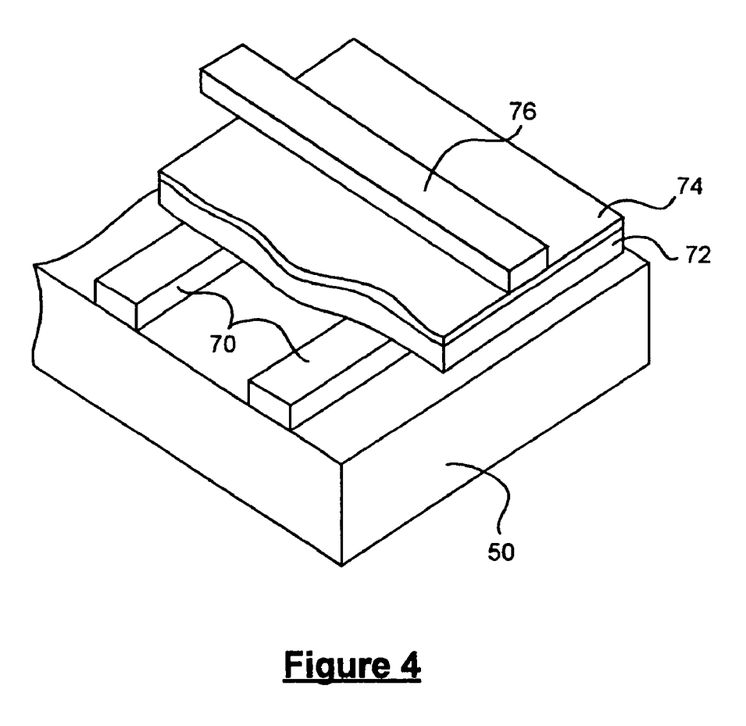
FIG. 4 is a diagrammatic layout view of a portion of memory array and addressing/sensing circuitry.

FIG. 4 is a simplified isometric diagram of a portion of a memory module circuit illustrating the general structure thereof. A pair of electrode conductors 70 are shown formed on the substrate 50 from a first metal layer. Two layers of semiconductor material 72, 74 are formed on the first metal layer. A conductor 76 extending transversely of the conductors 70 is formed from a second metal layer that overlays the semiconductor layers 72, 74. The semiconductor material is deposited on one or both of layers 72, 74 to connect to the conductors 70 and 76 of the first and second metal layers, so that memory cell elements such as diodes and fuses are formed. In FIG. 4 the semi-conductor layer as illustrated is continuous, however if the semiconductor material used has an isotropic conductivity, patterning of the semiconductor layer may be required.

In one preferred embodiment, diodes formed by the semiconductor layer(s) in the memory array act as both the diode (e.g. 28 in FIG. 2) and the fuse (27) of the memory elements. In this case the semiconductor layer(s) must perform the function of a fuse in that, under predetermined conditions, the diode junction characteristics change irrevocably to a high impedance state.

Fabrication and Assembly

Each layer of the memory module is advantageously constructed using a fast and inexpensive process to aid in achieving a low cost product. The use of a thin web substrate of flexible polymeric or metal (with dielectric film) material enables a relatively inexpensive roll-to-roll fabrication process to be employed, for example.

A web-processing technique referred to as emboss and lift-off described hereinbelow was originally developed for manufacturing a unique silver halide based photographic film at Polaroid™. The technology can be advantageously applied to produce the row and column electrodes for the cross-point memory array and address/sense lines since it has the ability to produce sub-micron sized features on plastic webs in an economical roll-to-roll process. An example of a micro-embossing process is described in U.S. Pat. No. 6,007,888 entitled "Directed Energy Assisted in Vacuo Micro Embossing", the disclosure of which is incorporated herein by reference. Alternatively, a conventional lithographic process may be used although currently the minimum feature size capability of such a process is limited to about 25 microns in a production environment.

The emboss lift/off process is illustrated and described in detail in the copending U.S. patent application entitled "Fabrication Techniques for Addressing Cross-Point Diode Memory Arrays," described above.

The above described emboss/lift-off process can be used to assemble two separate conductor layers for each memory module layer. The memory module layer (22) can then be completed by sandwiching a semiconductor layer between the two conductor layers. For example, an appropriate layer or layers of materials for providing the diode junction and fuse functions, as discussed above, may be laid over the conductor pattern on one substrate and then the conductor pattern on the other substrate brought into physical contact with the exposed surface of the semiconductor layer.

Figure 5:
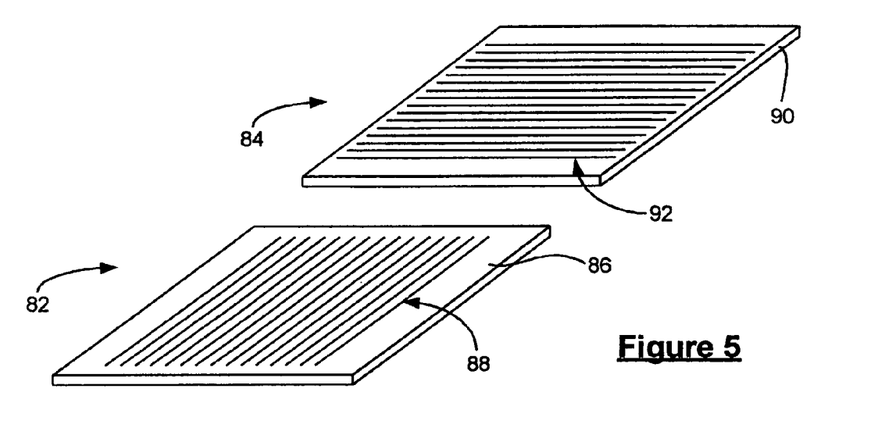
FIGS. 5 to 7 diagrammatically illustrate stages in a memory circuit sub-layer assembly process.

In FIG. 5, two sub-layers 82 and 84 are shown which may be separately created using the emboss/lift-off process. The sub-layer 82 comprises a first conductor arrangement 88 formed on substrate 86 which will form one of the conductor layers for a memory circuit. For example, the conductor arrangement 88 might comprise the column electrodes, the row address lines and row sense line(s), together with the contact pads and couplings associated therewith. The sub-layer 84 comprises a second conductor arrangement 92 formed on a substrate 90. The second conductor arrangement may comprise the row electrodes, column address lines, column sense line(s) and associated contacts and connections.

Figure 6:
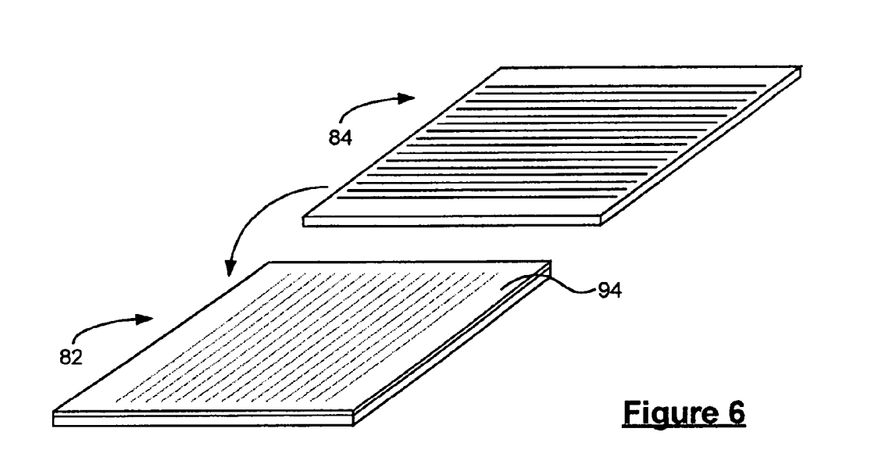
Figure 7:
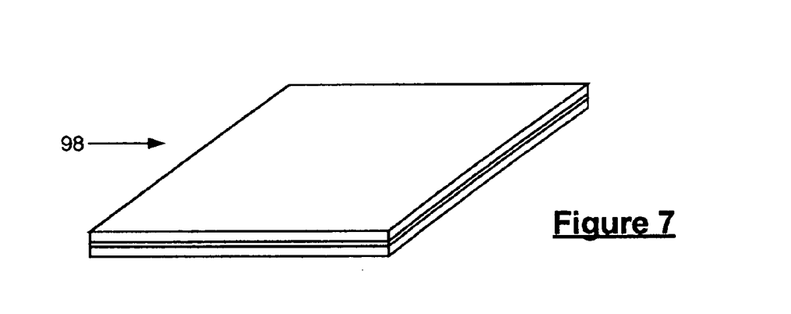

A semiconductor layer (94) or layers for forming diode junction and fuse functions is shown in FIG. 6 deposited over the first conductor arrangement on the substrate 86 of the first sub-layer 82. This forms electrical contact between the first conductor arrangement and one side of the semiconductor layer(s). The second sub-layer 84 is then placed inverted on top of the deposited semiconductor layer(s) so that the second conductor pattern makes contact with the other side of the semiconductor layer(s). The electrode conductors of the first and second sub-layers are arranged transverse (e.g. orthogonal) to one another to form cross-point junctions as discussed above. Since the circuit structures are all formed from cross-point diodes and interconnections therebetween, close alignment tolerance between the first and second sub-layers is not necessary. This forms the completed memory module layer illustrated at 98 in FIG. 7. A plurality of such layers can then be assembled into a memory module as described more detail in the copending U.S. patent application entitled Fabrication Techniques for Addressing Cross-Point Diode Memory Arrays," described above.

Structures and Methods for Fabrication and Assembly

The present invention involves a variation of the above manufacturing methods wherein multiple joined layers of memory modules are fabricated on a joint substrate wherein the substrate material is altered along a fold line to enable the layers to be folded over on each other. Alteration of the substrate material is done in any way that would enable a fold to be made along a fold line, including but not limited to by (1) removing a portion of the material, such as by creating perforations or depressions, (2) deforming the material, such as by creasing, or (3) altering the property of the material, such as by changing the strength or flexibility using ultraviolet light or a laser.

In one preferred embodiment, the multiple joined layers are preferably two or more layers of conductors that are perforated to enable folding of the conductor layers to sandwich a memory layer in between each contiguous conductor layers. Alternately, multiple joined layers may comprise one or more conductor layers joined to a memory layer and having perforations between each layer to enable folding of the layers on each other.

Figure 8:
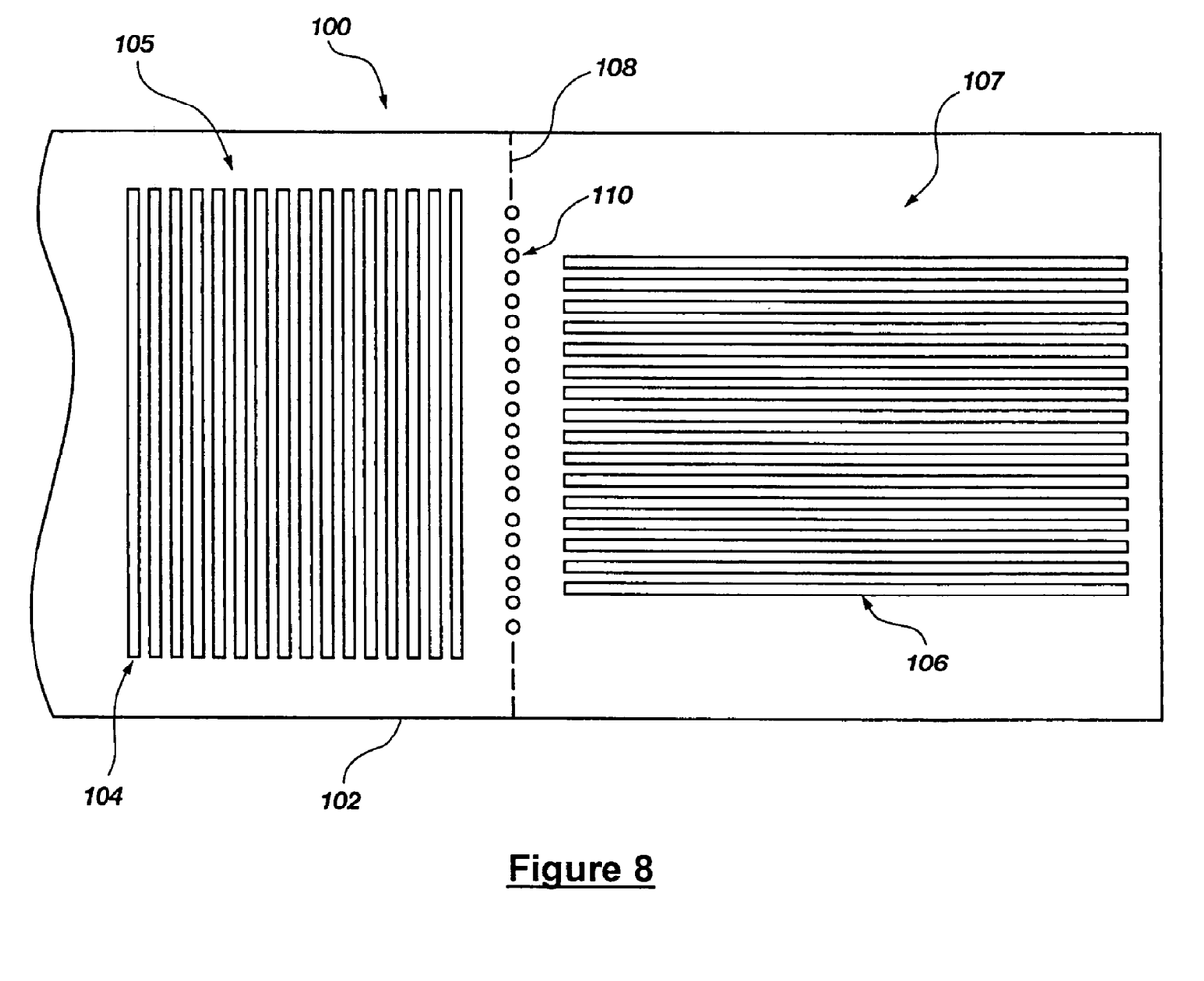
FIG. 8 is a diagrammatic layout view of two layers of conductors or wires joined by a perforated web in accordance with a preferred embodiment of the present invention.

With reference to FIG. 8, a preferred embodiment of a perforated sheet 100 comprising two layers of a memory module on a common substrate sheet 102 is shown. In a manner similar to FIGS. 3 and 4, an array of parallel electrode conductors or wires 104 is formed on one side 105 of the substrate 102 from a first metal layer. A second array of parallel electrode conductors or wires 106 is formed extending transversely of the conductors 102 on the other side 107 of common substrate sheet 102 opposite to conductors 104.

A fold line 128 comprised of spaced perforations 110 enables the substrate 102 to be folded over with electrode conductors 106 directly over and perpendicular to electrode conductors 104. Semiconductor material (not shown) is preferably deposited on one or both sides 105 and 107. An adhesive layer (not shown) may be inserted between the folded sides 105 and 107 to adhere the layers together. Alternately, the substrate sides or sections could adhere through thermoplastic heating or direct bonding. The electrode conductors 104 are disposed beneath the semiconductor layer and the electrode conductors 106 are disposed perpendicular to electrode conductors 104 directly over the semiconductor layer, as shown in FIGS. 3 and 4. Where the semiconductor material is deposited on sides 105 and/or 107 to connect with the conductors 104 and 106 of the first and second metal layers, and sides 105 and 107 are folded on the fold line, diode and fuse elements are formed.

Figure 9:
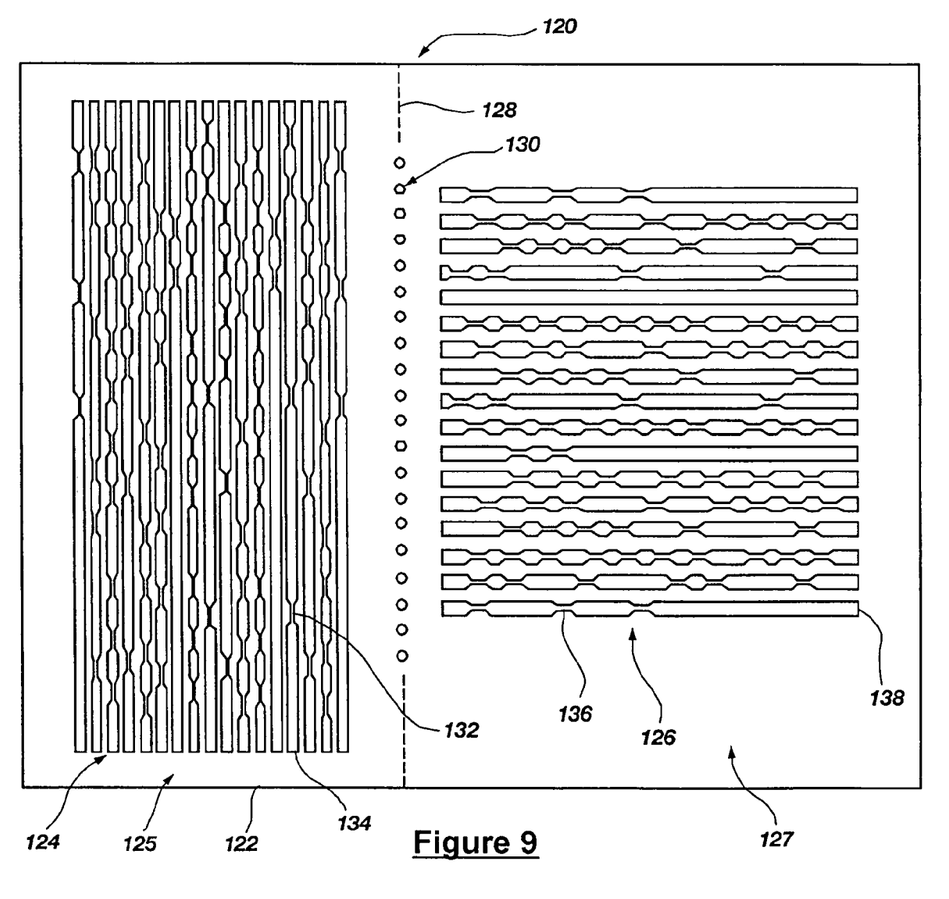
FIG. 9 is a diagrammatic layout view of two layers of conductors or wires of varying widths joined by a perforated web in accordance with another preferred embodiment of the present invention.

Referring now to FIG. 9, a similar structure is shown except that the electrodes are pre-shaped with varying widths. Specifically, a perforated sheet 120 comprising two layers of a memory module on a common substrate sheet 122 is shown. In a manner similar to FIGS. 3 and 4, an array of parallel electrode conductors 124 is formed on one side 125 of the substrate 122 from a first metal layer. A second array of parallel electrode conductors 126 is formed extending transversely of the conductors 124 on the other side 127 of common substrate sheet 122 opposite to conductors 124.

A fold line 128 comprised of spaced perforations 130 enables the substrate 122 to be folded over with electrode conductors 126 directly over and perpendicular to electrode conductors 124. A semiconductor layer (not shown) is deposited on one or more of the folded sides 125 and 127 so that the electrode conductors 124 are disposed beneath the semiconductor layer and the electrode conductors 126 are disposed perpendicular to electrode conductors 124 directly over the semiconductor layer, as shown in FIGS. 3 and 4. With sides 125 and 127 folded on each other along the fold line, the semiconductor material is aligned and connected with the conductors 124 and 126 of the first and second metal layers, so that diode and fuse elements are formed.

As described above, the current required to blow a fuse in the memory array (or the voltage to be applied to achieve that current) should be predictable, and controllable at the time of fabrication. Since it is current density through the memory elements that is the operative factor, the applied voltage/current at which an element will blow can be adjusted by varying the junction area of the element. For example, as shown at point 132 on a conductor 134 of the electrode array 124, the area of the cross-sectional area of the intersection of the cross-point electrodes is substantially reduced. This arrangement also reduces the current/voltage required to be applied to reach the critical current density to blow a fuse formed by point 132. Moreover, a point 136 formed on conductor 138 of array 126 has a substantially reduced cross-sectional area.

In the event that side 127 of substrate 122 is folded over at fold line 128 then point 136 will be disposed above point 132, with a semiconductor layer (not shown) deposited on one or both sides between to form a memory cell. The combined narrowed cross-sections of points 132 and 136 combine to provide a fuse that will blow at a much lower level of current or voltage than surrounding fuses having conductors that are wider in cross-section. This scheme is used in the design and fabrication of the memory circuits to ensure that relatively low control currents or voltages can be applied to blow only the desired cross-point fuses in pre-programmed applications, such as a read only memory (ROM).

Figure 10:
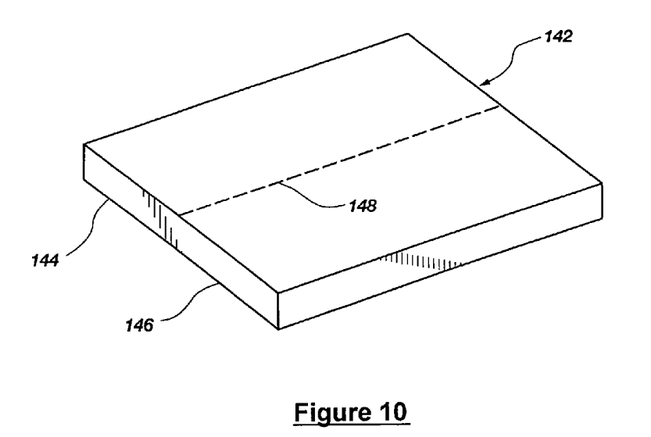
FIGS. 10 to 12 diagrammatically illustrate assembly stages in a memory circuit using the joined layers shown in FIGS. 8 or 9.
Figure 11:
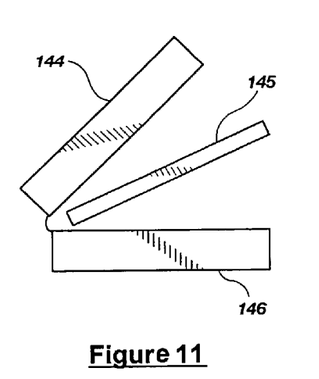
Figure 12:
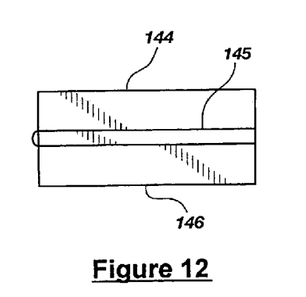

Referring now to FIGS. 10–12, an abstract perspective is shown of one embodiment of the present invention. Common substrate 142 is first treated by depositing semiconductor materials and patterns on one or both sections 144 and 146. The substrate 142 is divided by a fold line 148, preferably comprising a plurality of aligned perforations or the like. Sections 144 and 146 each have conductive layers thereon which are folded over upon each other as shown in FIGS. 11 and 12. Optionally, an anisotropic conductive layer 145 may be inserted between sections 144 and 146 to secure the sections together and form a plurality of diodes in the resulting matrix. Fold line is positioned so that sides 144 and 146 align to form diodes with the semiconductor layer. However, since the conductors on sides 144 and 146 are perpendicular to each other, precise alignment is not essential.

It should be understood that layer 145 is optional, and sections 144 and 146 may be adhered together by any other feasible means, such as by direct bonding or by thermoplastic heating.

Figure 13:
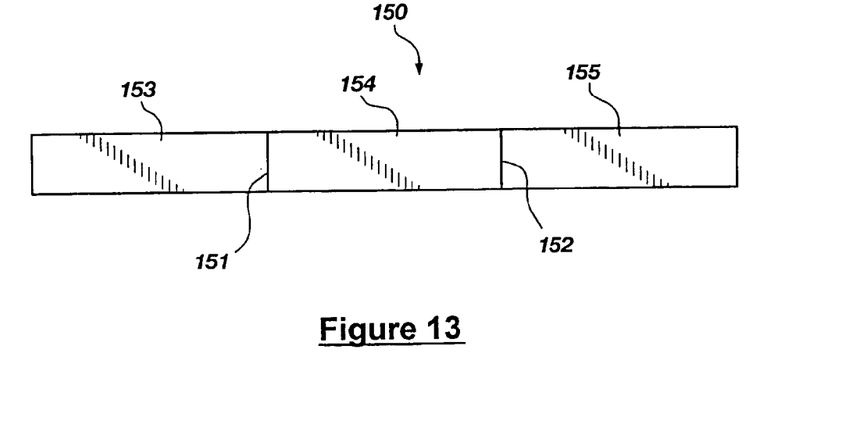
FIGS. 13 to 15 diagrammatically illustrate assembly stages in a memory circuit using three joined layers wherein the layers are folded on each other.
Figure 14:
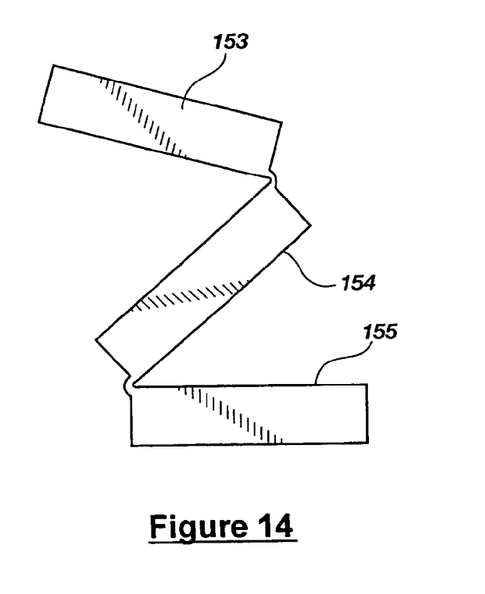
Figure 15:
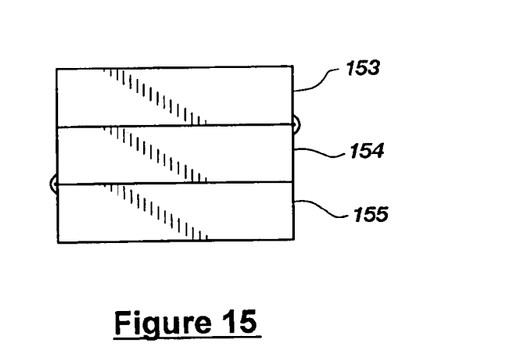
Figure 16:
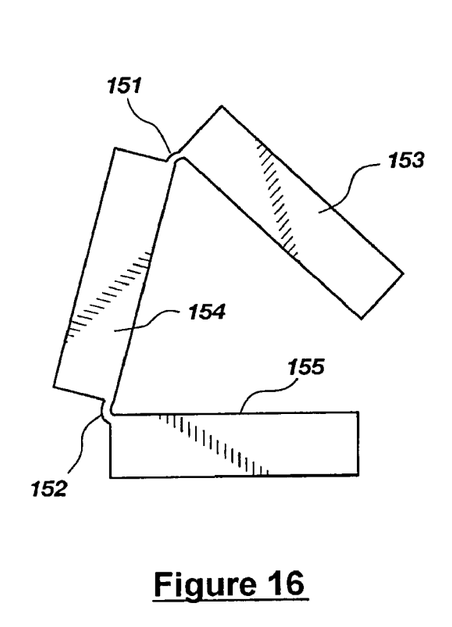
FIGS. 16 and 17 diagrammatically illustrate assembly stages in a memory circuit using the three joined layers shown in FIGS. 16 and 17, where the layers are folded on each other in an alternative manner.
Figure 17:
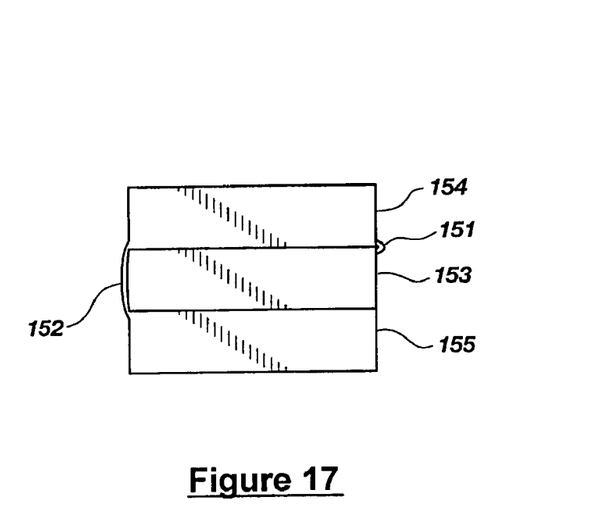

FIGS. 13–15 show another embodiment of the present invention. A common substrate 150 is provided with two fold lines 151 and 152 that divide the substrate into three side of approximately equal length 153, 154 and 155. The resulting substrate may be folded in at least two different ways. As shown in FIGS. 14 and 15, section 153 is folded to overlay section 154 so that section 154 is between section 153 and section 155. Layer 154 is preferably patterned with metal lines on both sides. Semiconductor devices are formed at the interface of layers 153 and 154 and the interface of layers 154 and 155. In FIGS. 16 and 17 an alternative embodiment is shown in which section 153 is folded between sections 154 and 155. In this arrangement section 153 is patterned with metal conductor lines on both sides. Semiconductor devices are formed at the interface between layers 153 and 154 and the interface between layer 154 and 155. In the embodiments shown in both FIGS. 13–15 and in FIGS. 16 and 17, the semiconductor devices may be deposited on either layer or on both layers at each layer interface mentioned above.

It should be understood that the thickness of the sections is shown to be greater than actual thickness, for illustration purposes only. Thus, hinge 152 is not likely to be stretched to the extent shown. Preferably, middle section 153 will be a little shorter than the other sections, rather than as shown in FIG. 17, to minimize any required stretching of hinge 152. The foregoing embodiments enable the fabrication of multiple layers on a single sheet of substrate, thereby simplifying and speeding production of the memory device. Moreover, the proper placement of the fold lines on the substrate facilitates alignment of adjacent layers, so that separate alignment machinery is not needed.

It should be understood that the scope of the present invention also contemplates more than two fold lines may be placed on the substrate to provide even more layers on one common substrate. As discussed above, in roll to roll substrate processing, many fold lines may be formed across the substrate sheet.

Moreover, the fold lines do not need to be parallel to each other, depending on the fabrication design. As discussed above, the fold lines may be formed in any manner that enables folding, including but not limited to perforations, depressions, creasing, and altering a property of the substrate material along the fold line.

The principles of the present invention can be applied with many other variations to the circuits, structures, arrangements and processes described herein, as will be apparent to those of ordinary skill in the art, without departing from the scope of the invention as defined in the appended claims.

We claim:

1. A method of fabricating multiple layers of a memory device, comprising:
   assembling a common substrate having multiple sections;
   constructing at least one fold line on the substrate to separate the multiple sections;
   fabricating memory structure on at least two sections of the substrate;
   depositing a semiconductor layer on at least one section of the substrate; and
   folding the substrate along the fold line to stack the multiple sections on top of each other and align the memory structures on adjacent folded sections so that the memory structures interact with each other to thereby form a plurality of diodes.

2. The method of fabricating multiple layers of a memory device recited in claim 1, wherein the memory structure on at least one section further comprises fabricating diode fuse patterns on at least one of the two sections, and aligning the two sections so that the diode fuse patterns coincide to form a matrix of diode fuses.

3. The method of fabricating multiple layers of a memory device recited in claim 1, wherein the fold line is fabricated by applying multiple aligned perforations.

4. The method of fabricating multiple layers of a memory device recited in claim 1, wherein the method comprises assembling a substrate having a fold line to form two sections.

5. The method of fabricating multiple layers of a memory device recited in claim 1, wherein at least two fold lines are fabricated on the substrate to provide at least three separate sections capable of folding to a stacked layer configuration.

6. The method of fabricating multiple layers of a memory device recited in claim 4 wherein the memory structure on the two sections are fabricated to include conductor grids, the grids on the first section being perpendicular to the grids on the second section.

7. The method of fabricating multiple layers of a memory device recited in claim 6, wherein the conductor grids of at least one of the first and second sections include conductors that vary in cross-section area at selected points on the conductors.

8. The method of fabricating multiple layers of a memory device recited in claim 5, wherein the sections are folded so that a center section on the substrate becomes a center layer of the folded sections.

9. The method of fabricating multiple layers of a memory device recited in claim 5, wherein the sections are folded so that one of the end sections on the substrate becomes a center layer of the folded sections.

10. The method of fabricating multiple layers of a memory device recited in claim 5 wherein the at least two fold lines are parallel with each other.

11. The method of fabricating multiple layers of a memory device recited in claim 5 wherein the at least two fold lines are not parallel with each other.

12. A method of fabricating multiple layers of a memory device, comprising:
    assembling a common substrate having multiple sections;
    constructing at least one fold line on the substrate to separate the multiple sections;
    fabricating memory structure on at least two sections of the substrate; and
    folding the substrate along the fold line to stack the multiple sections on top of each other and align the memory structures on adjacent folded sections to form at least one operable electrical device, wherein the memory structure on at least one section further comprises fabricating diode fuse patterns on at least one of the two sections, and aligning the two sections so that the diode fuse patterns coincide to form a matrix of diode fuses.

* * * * *